United States Patent [19]

Herberg

[11] Patent Number: 4,931,848
[45] Date of Patent: Jun. 5, 1990

[54] THYRISTOR HAVING INCREASED DI/DT STABILITY

[75] Inventor: Helmut Herberg, Munich, Fed. Rep. of Germany

[73] Assignee: Siemens Aktiengesellschaft, Berlin and Munich, Fed. Rep. of Germany

[21] Appl. No.: 770,887

[22] Filed: Aug. 30, 1985

[30] Foreign Application Priority Data

Sep. 27, 1984 [DE] Fed. Rep. of Germany ....... 3435550

[51] Int. Cl.$^5$ .......................................... H01L 29/78
[52] U.S. Cl. ..................................... 357/23.4; 357/38; 357/43; 357/86
[58] Field of Search ...................... 357/23.4, 38, 43, 86

[56] References Cited

FOREIGN PATENT DOCUMENTS 1915885 11/1983 Fed. Rep. of Germany .

OTHER PUBLICATIONS

Thyristor Handbook, A. Hoffmann and K. Stocker, Editors, Verlag Siemens AG, Berlin and Munich, 1965, pp. 27 and 28.
S. Sun et al., "Modeling of the On–Resis . . . ," IEEE Trans. on Elec. Dev., vol. ED-27, #2, Feb. 1980, pp. 356–367.
L. Leipold et al., "A FET–Controlled Thyristor in Sipmos Tech.," Proc. IEEE, 1980 IEDM, pp. 79–82, Dec. 1980.

Primary Examiner—Joseph E. Clawson, Jr.
Attorney, Agent, or Firm—Hill, Van Santen, Steadman & Simpson

[57] ABSTRACT

A thyristor has a semiconductor body which comprises an n-emitter provided with a first contact in a first principal surface, a p-base adjacent thereto, a p-emitter provided with a second contact in a second principal surface, and an n-base adjacent to the second principal surface. A high dI/dt stability is achieved since one of the emitters is formed of a plurality of emitter regions, the adjacent base is formed of a plurality of island-shaped base regions, and each of the base regions has a field effect transistor allocated to it via which an ignition current circuit for an emitter region respectively inserted into the base region proceeds. The field effect transistors of all base regions are driven via a common gate terminal for ignition.

4 Claims, 2 Drawing Sheets

THYRISTOR HAVING INCREASED DI/DT STABILITY

BACKGROUND OF THE INVENTION

The invention relates to a thyristor having increased dI/dt stability.

Such a thyristor is disclosed, for example, by the Thyristor Handbook, A. Hoffmann and K. Stocker, Editors, Verlag Siemens AG, Berlin and Munich, 1965, pages 27 and 28, incorporated herein by reference. It contains an annular auxiliary emitter region which surrounds a central trigger contact contacting the p-base in the one principle surface. The n-emitter likewise comprises an annular structure which surrounds the auxiliary emitter region. However, due above all to the width of the n-emitter, the ignition operation generally does not proceed fast enough so that a thermal destruction of the thyristor cannot be reliably prevented given a very fast rise of the load current flowing between the n-emitter and the p-emitter.

SUMMARY OF THE INVENTION

An object of the invention is to specify a thyristor of the type initially cited wherein this disadvantage does not occur. This is inventively achieved by designing the thyristor such that the emitter is formed of a plurality of emitter regions provided with contact parts connected to one another in an electrically conductive fashion. The base adjacent to the emitter is formed of a plurality of island-shaped base regions into which the various emitter regions are respectively inserted. An island-shaped base region has at least one field effect transistor allocated to it. The field effect transistor is formed of a source region comprising a same conductivity type as the emitter region in the base region. An edge zone of the island-shaped base region extends up to a principal surface and up to an edge of the source region. A gate electrode covers the edge zone and is separated from the principal surface by a thin, electrically insulating layer. A sub-region of the base adjacent to the island-shaped base region is provided, the sub-region being adjacent to the edge zone. The source region is provided with an electrically conductive coating which contacts the island-shaped base region. The gate electrodes of all field effect transistors are connected to a common gate terminal.

The advantage obtainable with the invention is that a division of the one emitter into a plurality of emitter regions, a division of the adjacent base into a plurality of island-shaped base regions, and a division of a transistor switch integrated into the semiconductor body and supplying the ignition current into a plurality of individual field effect transistors is undertaken. These substructures are then respectively disposed at a principle face of the thyristor such that every emitter region is surrounded by an island-shaped base region, and each of the base regions is in communication with a field effect transistor serving for supplying the ignition current. A significantly faster execution of the ignition operation is thus achieved than in the known thyristor. Following therefrom is a significant enhancement of the sensitivity to high rise rates of the load current, i.e. a significant increase of the dI/DT stability of the thyristor.

DESCRIPTION OF THE PREFERRED EMBODIMENTS

Figure 1:
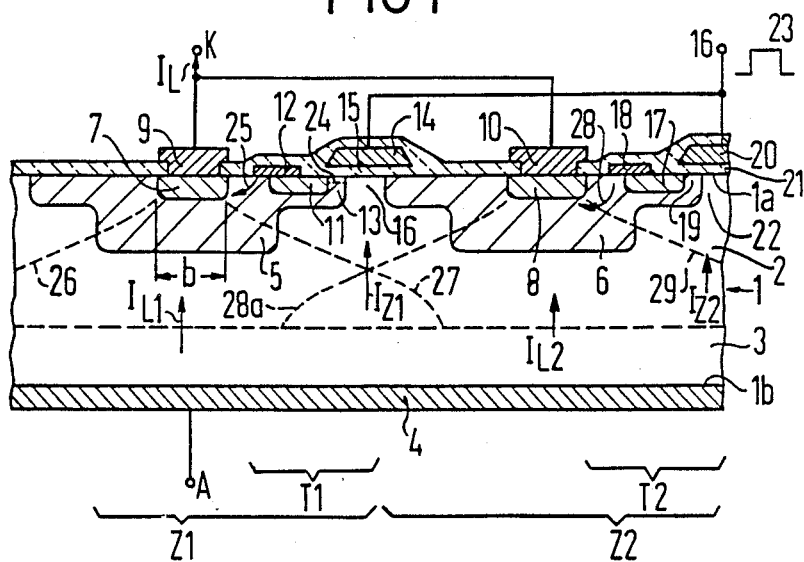
FIG. 1 is a first exemplary embodiment of the invention.

FIG. 1 shows a part of a thyristor which comprises a wafer-shaped semiconductor body 1 of doped semiconductor material. It contains an n-base layer 2 and a p-emitter layer 3 provided with an anode contact 4 applied to an anode terminal A at a principal face 1b of body 1. The n-base layer, whose doping concentration is about $10^{14} cm^{-3}$, extends up to a principal face 1a of body 1. The p-base of the thyristor is formed of a plurality of island-shaped p-base regions inserted into the n-base layer 2 such that they respectively extend up to the principal face 1a. Two of these p-base regions are referenced 5 and 6. The n-emitter is formed of a plurality of n-conductive emitter regions respectively inserted into the p-base regions such that they extend up to the principal face 1a. In FIG. 1, the n-emitter region inserted into p-base region 5 is referenced 7, and the n-emitter region inserted into the p-base region 6 is referenced 8. The n-emitter regions 7, 8, which have a doping concentration of, for example, $10^{20} cm^{-3}$, in the principal face 1a, are provided with respective contact parts 9, 10 connected to a cathode terminal K. The doping concentration of the p-base regions, for example 5, amounts to, for example $10^{17} cm^{-3}$ where they are adjacent to the inserted emitter regions, for example 7. Such island-shaped p-base regions are also provided in those parts of the semiconductor body 1 following at the left and right (not shown), whereby these n-emitter regions are again provided with contact parts which are connected to K. The mutually conductively interconnected contact parts, for example 9, 10 of all of these n-emitter regions, form the cathode contact of the thyristor.

The n-conductive source region 11 of an n-channel field effect transistor T1, is inserted into the island-shaped p-base region 5, this source region likewise extending up to the principal face and being provided therein with a conductive coating 12 which is extended in the direction toward the n-emitter region 7 so far that it projects beyond the lateral boundary of the region 11 and contacts the p-base region 5. An edge zone 13 of the p-base region 5 which extends up to the principal face 1a and up to the right-hand edge of the source region 11, is covered by a gate electrode 14 which is separated by a thin, electrically insulating layer 15 from the principal face 1a and is connected to a gate terminal 16. The sub-region 16 of the n-base layer 2, adjacent to the edge zone 13 at the right, forms the drain region of T1. T1 represents a substructure of a transistor switch allocated to the n-emitter region 7 via which, as shall be explained in greater detail below, an ignition current circuit which proceeds from the anode terminal A to the cathode terminal K is switched on when a positive ignition voltage pulse 23 is applied to the terminal 16.

Analogously thereto, the n-conductive source region 17 of an n-channel field effect transistor T2 is inserted into the island-shaped p-base region 6, this source region 17 being provided with a conductive coating 18 which contacts the p-base region 6. Also belonging to T2 is the edge zone 19 of the region 6 covered by a gate electrode 20. This gate electrode is separated from the boundary surface 1a by a thin, electrically insulating layer 21, and is connected to the gate terminal 16. The drain region of T2 is formed by the sub-region 22 of the n-base layer 2. T2 represents a sub-structure of the transistor switch allocated to the n-emitter region 8 via which a second ignition current circuit which proceeds from the anode terminal A to the cathode terminal K is switched on when the positive ignition voltage pulse 23 is applied to the terminal 16.

The parts 7, 5, and 11 through 16 belong to a first thyristor zone Z1 which comprises an ignition current circuit proceeding via T1. In an analogous fashion, the parts 8, 6, and 17 through 22 belong to a second thyristor zone 72 which contains an ignition circuit proceeding via T2. The further island-shaped p-base regions (not shown in detail) form further thyristor zones constructed in accordance with Z1 and Z2 and, next to an n-emitter region, respectively contain an edge-side field effect transistor to be interpreted as a sub-structure of the transistor switch. An allocated ignition current circuit between the terminals A and K is switched on via this field effect transistor.

According to a preferred development of the invention, the n-emitter regions 7, 8, etc., the source regions 11, 17, etc., the p-base regions 5, 6, etc., and the contacting parts 9, 10, 12, 18, 14, 20, etc., are respectively designed in strip-shaped fashion, whereby their dimensions in a direction proceeding roughly perpendicular to the plane of the drawing of FIG. 1 are greater than in the plane of the drawing. The transistor zones, for example Z1 and Z2, also comprise a strip shape.

In the exemplary embodiment shown in FIG. 1, a respective field effect transistor, for example T1, is disposed between two respective n-emitter regions, for example 7 and 8, an ignition current circuit to the one of the two n-emitter regions, for example 7, proceeding via this respective field effect transistor.

The width b of an n-emitter region, for example 7, is advantageously selected smaller as measured in the direction toward the neighboring n-emitter region, for example 8, than the lateral distance between these two emitter regions, for example 7 and 8. In FIG. 1, b amounts to about 1/5 of this distance. It has turned out that, in the current-conducting condition of the thyristor, such a great fanning of the current paths respectively occurring between the n-emitter regions 7, 8, etc., and the p-emitter layer 3 occurs such that, with a given plurality of n-emitter regions, a reduction of the principal surface 1a of the thyristor resulting from this dimensioning of b can be exploited without having to accept a noteworthy reduction in the maximum allowable load current. In particular, the width b can be selected about one order of magnitude smaller than the lateral distance without a significant reduction of the maximum allowable load current. Given such a distance of, for example 100 μm, the width b can be reduced, for example, to 10 μm. The width of the source regions, for example 11, is preferably matched to the width of the n-emitter regions, for example 7. The thickness of the thyristor between its two principal surfaces 1a and 1b should preferably be greater than half the lateral distance between two neighboring n-emitter regions, for example 7 and 8.

In the inhibited condition of the thyristor, for example, a voltage of 1000 volts is present between the terminals A and K, whereby the terminal A has a more positive potential than K. When the positive ignition voltage pulse 23 is applied to 16, then an inversion layer 24 is formed in the edge zone 13 below the gate electrode 14, this inversion layer 24 representing a conductive channel between the source region 11 and the drain region 16. An ignition current $I_{Z1}$ flows via this channel from the terminal A to the source region 11 and, from the latter, via the conductive coating 12 in the direction of the arrow 25, to the pn-junction between the parts 7 and 5. The n-emitter region 7 then injects negative charge carriers into the p-base region 5 which are transported in the direction toward the p-emitter layer 3 and, at the pn-junction between the layers 2 and 3, cause an injection of positive charge carriers into the n-base layer 2. Together with the positive charge carriers injected from 3, the negative charge carriers injected from 7 form a so-called storage charge which, after the dismantling of the space charge zone at the pn-junction between the parts 5 and 2, is distributed to the p-base region 5 and the n-base layer 2. The lateral boundaries of this storage charge are indicated by the broken lines 26 and 27, whereby the conductivity of the semiconductor body 1 within the boundaries 26 and 27 is significantly greater than would correspond to the basic doping of the parts 5 and 2. Resulting therefrom is a load current component $L_{l1}$ of the thyristor zone Z1 which flows between the terminals A and K.

In an analogous fashion, the ignition voltage pulse 23 produces an ignition current $I_{Z2}$ in the thyristor zone Z2 which is supplied to the pn-junction between the parts 8 and 6 along the arrow 28 via the transistor T2 which is switched on. Resulting therefrom in the thyristor zone Z2 is a load current component $I_{L2}$. The load current components $I_{L1}$ and $I_{L2}$ together with the corresponding load current components of further thyristor zones combine to form the load current $I_L$ of the thyristor.

Of essential significance is that the ignition voltage pulse 23 produces ignition currents $I_{Z1}$, $I_{Z2}$, etc., practically simultaneously in all thyristor zones, for example Z1 and Z2, these ignition currents allowing load current components $I_{L1}$, $I_{L2}$, etc., to arise practically simultaneously. Due to the distribution of the individual thyristor zones, for example Z1 and Z2, to the entire principle surface 1a, this, however, means that the ignition of the thyristor covers the latter practically simultaneously, so that a very fast sequence of the ignition operation is guaranteed. A load current $I_L$ having a very high dI/dt value, i.e. having a very high current increase rate, can also be reliably switched.

As a result of the appearance of the storage charge 26, 27, the forward resistance of the parts of the layers 2 and 3 permeated by the ignition current $I_{Z1}$ is reduced, this resulting in a corresponding increase of $I_{Z1}$ during the application of the ignition voltage pulse 23. The same is also true for the ignition currents $I_{Z2}$, etc., of the remaining thyristor zones Z2, etc., in which storage charges likewise appear.

These effects of the storage charges can be further enhanced in that, for two thyristor zones lying next to one another, for example Z1 and Z2, the forward resistance of the layers 2 and 3 for the ignition current, for example $I_{Z1}$, of the one thyristor zone, for example Z1, is reduced not only by the storage charge below the corresponding n-emitter region, for example 7, but is also reduced by the storage charge, for example 28a, 29, below the n-emitter region, for example 8, of the other thyristor zone, for example Z2. This occurs when the corresponding storage charges according to FIG. 1 mutually overlap. In order to achieve an overlap, it is preferable to select the lateral distance between the n-emitter regions, for example 7 and 8, of two neighboring thyristor zones, for example Z1 and Z2, such that it roughly corresponds to the lateral distance between the n-emitter region of the one thyristor zone, for example Z1, and the edge zone, for example 13, of the field effect transistor, for example T1, allocated thereto.

Figure 2:
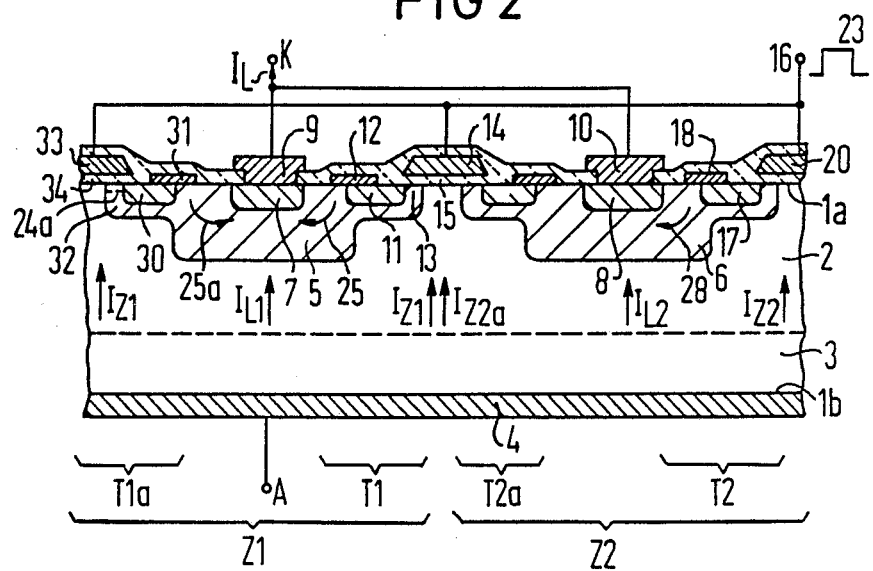
FIG. 2 is a second exemplary embodiment.

FIG. 2 shows a second exemplary embodiment of the invention wherein, in addition to the source region 11, a second source region 30 is inserted into the island-shaped p-base region 5, this second source region 30 being provided in the principal surface 1a with a conductive coating 31 which is extended in the direction toward the n-emitter region 7 such that it projects beyond the pn-junction between 30 and 5 and contacts the region 5. An edge zone 32 of the region which extends up to the principal surface 1a and up to the left-hand edge of the source region 30 is covered by a gate electrode 33 which is separated from 1a by a thin, electrically insulating layer 34. Together with the hitherto described gate electrodes 14 and 20, the gate electrode 33 is applied to the common gate terminal 16. In FIG. 2, the parts already described are provided with the same reference characters as in FIG. 1.

An ignition current $I_{Z1a}$ is supplied to the n-emitter region 7 via the field effect transistor T1a formed by the parts 30, 32, 2, 3, 33, 34 and 31, this being indicated by the arrow 25a. The inversion channel forming under 33 given application of the ignition voltage pulse 23, and via which the ignition current circuit for $I_{Z1a}$ proceeds, is referenced 24a. In a corresponding fashion, a further field effect transistor T2a is disposed at the left-hand edge of the island-shaped p-base region 6, via which an ignition current $I_{Z2a}$ is supplied to the n-emitter region 8. Preferably, the gate electrode 14 is shared by the transistors T1 and T2a. The other p-base regions which are not shown also respectively comprise an additional field effect transistor in this exemplary embodiment.

The techniques explained with reference to FIG. 1 for reducing the width of the individual n-emitter regions, for example 7, in relationship to the lateral distance between two mutually adjacent n-emitter regions, for example 7 and 8, can also be applied to the arrangement of FIG. 2. Also valid is the dimensioning rule mentioned above for the minimum thickness of the semiconductor body 1 between the principal faces 1a and 1b which should be greater than half the lateral distance between two mutually adjacent n-emitter regions, for example 7 and 8.

According to a first development of the arrangement of FIG. 2, the regions 7, 8, 11, 17 and 30 as well as the parts 9, 10, 12, 14, 18, 20, 31, and 33 are designed strip-shaped, whereby their dimensions in a direction proceeding roughly perpendicular to the plane of the drawing of FIG. 2 are greater than in this plane of the drawing.

Figure 3:
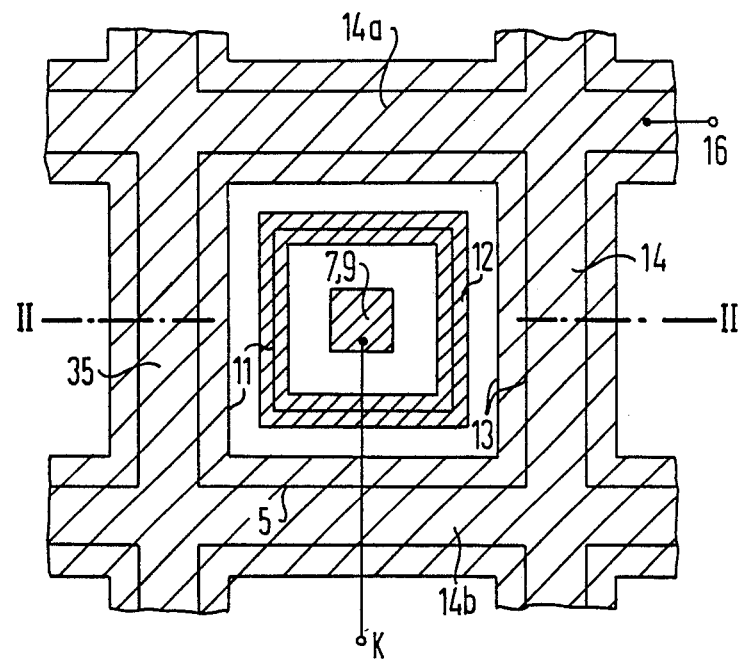
FIG. 3 is a plan view of a thyristor constructed in accordance with FIG. 2.

A second preferred development can be derived from the plan view of the thyristor of FIG. 2 which is shown in FIG. 3. In accordance therewith, the n-emitter region 7 has a square or rectangular shape in the principal surface 1a. The contact part 9 in FIG. 3 has the same lateral limitations as the region 7 and is shown in shaded fashion. The source region 11 and the edge zone 13 proceed along the lateral lines of a square or rectangle and are self-contained, so that they surround the region 7 at all sides. The conductive coating 12, which is shown shaded in FIG. 3, likewise surrounds the region 7 at all sides. The gate electrode 14 represents a part of an electrode grid 14, 14a, 14b and 35 which is likewise shaded.

One of the thyristor zones Z1, Z2, etc. is situated in each of the square or rectangular clearances of the electrode grid of FIG. 3. Deriving therefrom is a cell concept of the thyristor. FIG. 2 shows a cross-section through the thyristor shown in FIG. 3 along the dot-dash line II—II.

In addition to the embodiment of the invention described up to now, embodiments are also of interest wherein the hitherto cited semiconductor regions are respectively replaced by regions having the opposite conductivity type, whereby voltages or currents having the opposite operational sign are employed instead of the voltages or currents hitherto cited. In these cases, the designations of the terminals A and K are also to be interchanged.

Although various minor changes and modifications might be proposed by those skilled in the art, it will be understood that I wish to include within the claims of the patent warranted hereon all such changes and modifications as reasonably come within my contribution to the art.

I claim as my invention:

1. A thyristor, comprising:
    a semiconductor body having a first conductivity type first emitter provided with a first contact at a first principal surface of the semiconductor body;
    a second conductivity type base adjacent to the first emitter;
    a second conductivity type second emitter provided with a second contact at a second principal surface of the semiconductor body;
    a first conductivity type second base adjacent to the second emitter and separated from the first base by pn-junction;
    the first emitter comprising a plurality of emitter regions each provided with a contact, the contacts being connected to one another in an electrically conductive fashion;
    the first base comprising a plurality of island-shaped base regions each having a respective one of said emitter regions inserted therein;
    each of the island-shaped base regions having at least one field effect transistor allocated to it;
    said field effect transistor being formed of a source region of first conductivity type inserted in the base region, a portion of the second base extending up to the first principal surface forming a drain region, and an edge zone of the island-shaped base region extending up to the first principal surface between the portion of the second base and the source region, a gate electrode covering said edge zone and separated from the first principal surface by a thin electrically insulating layer, and the source region being provided with an electrically conductive coating which also contacts the island-shaped base region;
    gate electrodes of all field effect transistors being connected to a common gate terminal; and
    a width of one of the emitter regions measured in a direction toward a neighboring emitter region being smaller by an order of magnitude than a lateral distance between these two emitter regions.

2. A thyristor, comprising:

a semiconductor body having a first conductivity type first emitter provided with a first contact at a first principal surface of the semiconductor body;

a second conductivity type base adjacent to the first emitter;

a second conductivity type second emitter provided with a second contact at a second principal surface of the semiconductor body;

a first conductivity type second base adjacent to the second emitter and separated from the first base by pn-junction;

the first emitter comprising a plurality of emitter regions each provided with a contact, the contacts being connected to one another in an electrically conductive fashion;

the first base comprising a plurality of island-shaped base regions each having a respective one of said emitter regions inserted therein;

each of the island-shaped base regions having at least one field effect transistor allocated to it;

said field effect transistor being formed of a source region of first conductivity type inserted in the base region, a portion of the second base extending up to the first principal surface forming a drain region, and an edge zone of the island-shaped base region extending up to the first principal surface between the portion of the second base and the source region, a gate electrode covering said edge zone and separated from the first principal surface by a thin electrically insulating layer, and the source region being provided with an electrically conductive coating which also contacts the island-shaped base region;

gate electrodes of all field effect transistors being connected to a common gate terminal; and a thickness of the semiconductor body between said first and second principal surfaces being greater than a lateral distance between an emitter region and an edge zone of a field effect transistor in the same island-shaped base region.

3. A thyristor, comprising:

a semiconductor body having a first conductivity type first emitter provided with a first contact at a first principal surface of the semiconductor body;

a second conductivity type base adjacent to the first emitter;

a second conductivity type second emitter provided with a second contact at a second principal surface of the semiconductor body;

a first conductivity type second base adjacent to the second emitter and separated from the first base by pn-junction;

the first emitter comprising a plurality of emitter regions each provided with a contact, the contacts being connected to one another in an electrically conductive fashion;

the first base comprising a plurality of island-shaped base regions each having a respective one of said emitter regions inserted therein;

each of the island-shaped base regions having at least one field effect transistor allocated to it;

said field effect transistor being formed of a source region of first conductivity type inserted in the base region, a portion of the second base extending up to the first principal surface forming a drain region, and an edge zone of the island-shaped base region extending up to the first principal surface between the portion of the second base and the source region, a gate electrode covering said edge zone and separated from the first principal surface by a thin electrically insulating layer, and the source region being provided with an electrically conductive coating which also contacts the island-shaped base region;

gate electrodes of all field effect transistors being connected to a common gate terminal;

every emitter region provided in an island-shaped base region being surrounded by a source region which is in turn surrounded by the edge zone of this island-shaped base region;

the source region and the edge zone proceeding roughly along lateral lines of a rectangle; and a grid of gate electrodes being arranged between the juxtaposed edge zones of a plurality of island-shaped base regions.

4. A thyristor, comprising:

a semiconductor body having a first conductivity type first emitter provided with a first contact at a first principal surface of the semiconductor body;

a second conductivity type base adjacent to the first emitter;

a second conductivity type second emitter provided with a second contact at a second principal surface of the semiconductor body;

a first conductivity type second base adjacent to the second emitter and separated from the first base by pn-junction;

the first emitter comprising a plurality of emitter regions each provided with a contact, the contacts being connected to one another in an electrically conductive fashion;

the first base comprising a plurality of island-shaped base regions completely surrounded by portions of the second base, each base region having a respective one of said emitter regions inserted therein;

each of the island-shaped base regions having at least one field effect transistor allocated to it;

said field effect transistor being formed of a source region of first conductivity type inserted in the base region, a portion of the second base extending up to the first principal surface forming a drain region, and an edge zone of the island-shaped base region extending up to the first principal surface between the portion of the second base and the source region, a gate electrode covering said edge zone and separated from the first principal surface by a thin electrically insulating layer, and the source region being provided with an electrically conductive coating which also contacts the island-shaped base region;

the gate electrode being common to a field effect transistor in two adjacent island-like base regions;

gate electrodes of all field effect transistors being connected to a common gate terminal; and a width of one of the emitter regions measured in a direction toward a neighboring emitter region being smaller by an order of magnitude than a lateral distance between the two emitter regions, and a thickness of the semiconductor body between said first and second principal surfaces being greater than a lateral distance between an emitter region and an edge zone of a field effect transistor in the same island-shaped base region.

* * * * *